(12) United States Patent
Malocha

(10) Patent No.: US 10,931,259 B1
(45) Date of Patent: Feb. 23, 2021

(54) ACOUSTO-ELECTRIC AMPLIFIER HAVING INSERTION GAIN

(71) Applicant: Pegasense, LLC, Winter Springs, FL (US)

(72) Inventor: Donald Chester Malocha, Winter Springs, FL (US)

(73) Assignee: Pegasense, LLC, Winter Springs, FL (US)

( * ) Notice: Subject to any disclaimer, the term of this patent is extended or adjusted under 35 U.S.C. 154(b) by 0 days.

(21) Appl. No.: 16/898,620

(22) Filed: Jun. 11, 2020

Related U.S. Application Data

(60) Provisional application No. 62/907,147, filed on Sep. 27, 2019.

(51) Int. Cl.
| | |
|---|---|
| *H03H 9/02* | (2006.01) |
| *H03H 9/145* | (2006.01) |
| *H03H 9/64* | (2006.01) |

(52) U.S. Cl.
CPC ...... *H03H 9/1455* (2013.01); *H03H 9/02842* (2013.01); *H03H 9/6489* (2013.01)

(58) Field of Classification Search
CPC . H03H 9/02842; H03H 9/1455; H03H 9/6489
USPC .................................................. 333/193–195
See application file for complete search history.

(56) References Cited

U.S. PATENT DOCUMENTS

| | | | | |
|---|---|---|---|---|
| 7,268,662 | B2* | 9/2007 | Hines | B82Y 15/00 338/28 |
| 7,623,037 | B1* | 11/2009 | Malocha | G06K 19/0672 333/193 |
| 7,777,625 | B1* | 8/2010 | Puccio | G06K 19/0672 340/572.1 |
| 9,970,902 | B2* | 5/2018 | Malocha | G01N 29/022 |
| 2012/0174678 | A1* | 7/2012 | Gallagher | H03H 9/642 73/658 |
| 2017/0254780 | A1* | 9/2017 | Malocha | G01N 29/30 |

OTHER PUBLICATIONS

Adler, "Simple Theory of Acoustic Amplification", IEEE Transactions on Sonics and Ultrasonics, Jul. 1971, pp. 115 through 118, vol. SU-18, No. 3, IEEE.
Adler, "Surface-Wave Amplifier with Improved Geometry", Electronics Letters, Jan. 10, 1972, pp. 65 through 66, vol. 8, No. 3.
Auld et al., "Normal Mode Theory for Acoustic Waves and its Application to the Interdigital Transducer", IEEE Transactions on Electron Devices, Oct. 1971, pp. 898-908, vol. ED-18, No. 10, IEEE.

(Continued)

*Primary Examiner* — Dean O Takaoka
(74) *Attorney, Agent, or Firm* — Fogg & Powers LLC

(57) ABSTRACT

An acousto-electric amplifier having insertion gain is provided. The acousto-electric amplifier comprises resistive material coupled to sensors such as conductive fingers. The conductive fingers are disposed on piezoelectric material. The piezoelectric material may be disposed on or above the piezoelectric material. Transducers may be used to couple a surface acoustic wave to and from the acousto-electric amplifier. The acousto-electric amplifier amplifies the surface acoustic wave in one propagation direction and attenuates a surface wave in the opposite propagation direction.

22 Claims, 10 Drawing Sheets

(56) References Cited

OTHER PUBLICATIONS

Bandhu et al., "Macroscopic acoustoelectric charge transport in graphene", Applied Physics Letters 103, Sep. 23, 2013, pp. 1-5, AIP Publishing LLC.

Blotekjaer et al., "Acoustic Surface Waves in Piezoelectric Materials with Periodic Metal Stripts on the Surface", IEEE Transactions on Electron Devices, Dec. 1973, vol. ED-20, No. 1, pp. 1139-1146, IEEE.

Bolotin et al., "Ultrahigh electron mobility in suspended graphene", Solid State Communications 146, Feb. 27, 2008, pp. 351-355, ScienceDirect, Elsevier.

Carmichael et al., "Experimental Investigation of Surface Acoustic Wave Acoustoelectric Effect using a Graphene Film on Lithium Niobate", IEEE Transactions on Ultrasonics, Ferroelectrics, and Frequency Control, Nov. 2018, pp. 2205 through 2207, vol. 65, No. 11, IEEE.

Carmichael, "Asymmetric energy coupling through acoustoelectric effect using graphene on lithium niobate surface acoustic wave delay line in GHz range", 2019 IEEE International Ultrasonics Symposium (IUS), Oct. 2019, pp. 702 through 705, IEEE, Glasgow, Scotland.

Chen et al., "Acoustically induced current in graphene by aluminum nitride transducers", Applied Physics Letters 108, Jan. 20, 2016, pp. 1-6, AIP Publishing LLC.

Collins et al., "Amplification of Acoustic Surface Waves with Adjacent Semi-Conductor and Piezoelectric Crystals", Applied Physics Letters, Nov. 1, 1968, vol. 13, No. 9, pp. 1-4, The American Institute of Physics.

Ghosh, "FDSOI on Lithium Niobate Using AL2O3 Wafer-Bonding for Acoustoelectric RF Microdevices", Transducers 2019—Eurosensors XXXIII, Jun. 2019, pp. 535-538, IEEE.

Hutson et al., "Elastic Wave Propagation in Piezoelectric Semiconductors", Journal of Applied Physics, Jan. 1962, pp. 40-47, vol. 33, No. 1, The American Institute of Physics.

Kino et al., "A Normal Mode Theory for the Rayleigh Wave Amplifier", IEEE Transactions on Electron Devices, Oct. 1971, vol. ED-18, No. 10, pp. 909-920, IEEE.

Kino et al., "A Strip Coupled Rayleigh Wave Amplifier", W.W. Hansen Laboratories oh Physics, Stanford University, Stanford, California, at least as early as Mar. 27, 2020, pp. 177-180.

Kino, "Acoustoelectric Interactions in Acoustic-Surface-Wave Devices", Proceedings of the IEEE, May 1976, pp. 724-748, IEEE.

Lakin et al., "Surface Wave Delay Line Amplifiers", IEEE Transactions on Microwave Theory and Techniques, Nov. 1969, pp. 912-920, vol. MTT-17, No. 11, IEEE.

Maerfeld et al., "An Acoustoelectric Multistrip Amplifier", Thomson-CSF, ASM Division, 0682 Cagnes-sur-Mer France, at least as early as Dec. 19, 2000, pp. 171-176.

Malocha et al., "Acoustoelectric Amplifier with 1.2 dB Insertion Gain Monolithic Graphene Construction and Continuous Wave Operation", IEEE Transactions on Ultrasonics, Ferroelectrics, and Frequency Control, Mar. 30, 2020, pp. 1 through 4, IEEE.

Malocha et al., "Thin Film Acoustoelectric GHz Saw Amplifier Design", 2018 IEEE International Ultrasonics Symposium (IUS), Kobe, 2018, pp. 1 through 4, IEEE.

Miseikis et al., "Acoustically induced current flow in graphene", Applied Physics Letters 100, 133105, Mar. 27, 2012, pp. 1 through 5, American Institute of Physics.

Santos et al., "Acousto-electric transport in epitaxial monolater graphene on SiC", Applied Physics Letters 102, 221907, Jun. 5, 2013, pp. 1 through 4, AIP Publishing LLC.

White, "Amplification of Ultrasonic Waves in Piezoelectric Semiconductors", Journal of Applied Physics, Aug. 1962, pp. 2547 through 2554, vol. 33, No. 8, American Institute of Physics.

White, "Surface Elastic-Wave Propagation and Amplification", IEEE Transactions on Electron Devices, Apr. 1967, pp. 181 through 189, vol. ED-14, No. 4, IEEE.

* cited by examiner

ACOUSTO-ELECTRIC AMPLIFIER HAVING INSERTION GAIN

CROSS-REFERENCE TO RELATED APPLICATIONS

The present application claims benefit of U.S. Patent Application Ser. No. 62/907,147 filed Sep. 27, 2019; the entire contents of the aforementioned patent application is incorporated herein by reference as if set forth in its entirety.

U.S. GOVERNMENT LICENSE RIGHTS

This invention was made with Government support under Contract No. HR001117C0017 awarded by the Defense Advanced Research Projects Agency. The Government has certain rights in the invention.

BACKGROUND

Surface acoustic waves (SAWs) are sound waves that travel parallel to a surface of an elastic material and are confined, e.g., within roughly one wavelength of the surface. Typically SAW devices are made with an elastic material that is a piezoelectric material.

Piezoelectric material is formed by an anisotropic crystalline structure. The anisotropic crystalline structure exhibits dipoles having polarization vectors in the same direction. Piezoelectric material can be used to convert mechanical energy into electrical energy and vice versa.

Electrical energy can be coupled to the piezoelectric material with a transducer. A transducer may comprise, e.g., two sets of conductive fingers where the conductive fingers of one set are interlaced or interdigitated with the conductive fingers of the other set. Each set of conductive fingers can be formed on the piezoelectric material. A synchronous frequency, or center frequency of the operating band, of the transducer is defined by a phase velocity of the piezoelectric material divided by a pitch, or separation distance, between adjacent conductive fingers of one set. Upon applying a periodic, e.g. sinusoidal, electric field to each set, interlaced regions of tensile and compressive stress are generated between the conductive fingers of each set. Such alternating stress generates the surface acoustic wave. The alternating stress also causes dipoles at the surface of the piezoelectric material to rotate, thus causing a varying electric field. As it travels along the surface of the piezoelectric material, the mechanical wave causes dipoles at the surface to rotate. As a result, a periodic electric potential propagates in phase with the mechanical wave. The propagating mechanical wave and propagating electric potential have a frequency equal to the synchronous frequency. The surface acoustic wave comprises both the propagating mechanical wave and the propagating electric potential.

SAW devices have been used as filters, for example in the front end of receivers. A two-port SAW filter includes at least a pair of transducers formed on piezoelectric material. For example, in a receiver, the SAW filter is configured to be inserted between an antenna and a low noise amplifier of the front end of the receiver. The SAW filter provides high selectivity and can diminish effects of interfering signals near the radio frequency band of the receiver.

Typically SAW filters are passive devices having an insertion loss. A SAW filter having insertion loss placed before a low noise amplifier diminishes sensitivity of the receiver. Active SAW filters have been demonstrated. However, such devices have exhibited undesirable increased insertion loss in comparison to a corresponding passive SAW filter lacking the active element. Further, such devices have exhibited excessive heat dissipation diminishing their operating lifetime and making them useable at room temperature with only pulsed signals.

SUMMARY

A method is provided. The method comprises: receiving a surface acoustic wave (SAW) propagating parallel to a surface of a piezoelectric material and in the piezoelectric material; applying an electric potential across resistive material to induce majority carrier flow in the resistive material in a same direction as a direction of travel of the SAW, where the majority carriers have a carrier drift velocity greater than a velocity of the SAW in the piezoelectric material; sensing, in the beam width, electric potentials of the SAW in the piezoelectric material at different points normal to the axis in which the SAW travels; coupling the sensed electric potentials to the resistive material; generate moving potential wells, in the resistive material, which carry charge in a direction of movement of the SAW; injecting charge from the induced majority carrier flow into the moving potential wells to increase energy stored in the moving potential wells; conveying the increased energy to the SAW; and amplifying amplitudes of the electric potentials of the SAW, and thus also amplifying an amplitude of a mechanical wave of the SAW.

DRAWINGS

Understanding that the drawings depict only exemplary embodiments and are not therefore to be considered limiting in scope, the exemplary embodiments will be described with additional specificity and detail using the accompanying drawings, in which.

DETAILED DESCRIPTION

Figure 1A:
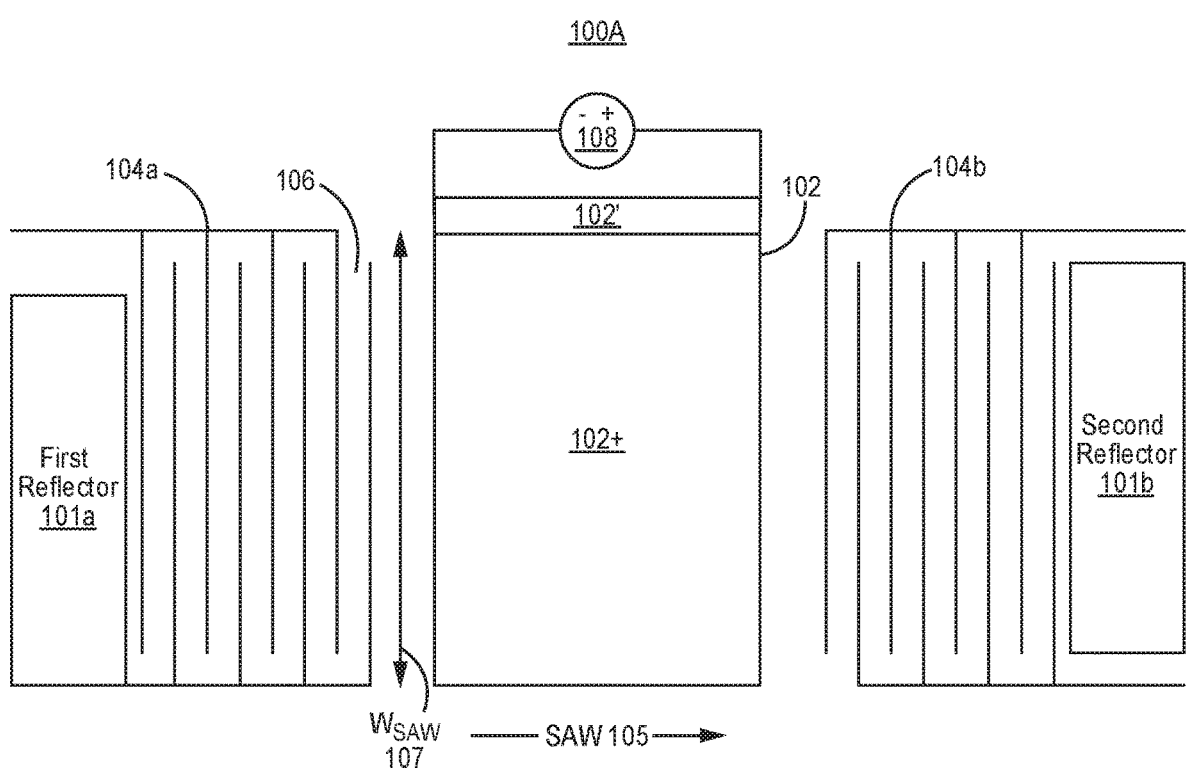
FIG. 1A illustrates a plan view of one embodiment of an active SAW filter including an acousto-electric amplifier having insertion gain.

In the following detailed description, reference is made to the accompanying drawings that form a part hereof, and in which is shown by way of illustration specific illustrative embodiments. However, it is to be understood that other embodiments may be utilized, and that structural, mechanical, and electrical changes may be made. Furthermore, the method presented in the drawing figures and the specification is not to be construed as limiting the order in which the individual steps may be performed. The following detailed description is, therefore, not to be taken in a limiting sense.

There has been a long felt need to develop an acousto-electric amplifier having insertion gain. Insertion gain means a gain, expressed as a ratio of output signal power versus input signal power, resulting from the insertion of the acousto-electric amplifier, e.g. in a SAW filter, in lieu of a free surface of piezoelectric material of equal length. Insertion loss of an acousto-electric amplifier means a loss, expressed as a ratio of output signal power versus input signal power, resulting from the insertion of the acousto-electric amplifier, e.g. in a SAW filter. Thus, insertion gain or loss can be readily determined by comparing an active SAW filter including an acousto-electric amplifier having insertion gain with a corresponding passive SAW filter which lacks the acousto-electric amplifier. The acousto-electric amplifier is the active device in the active SAW filter. The corresponding passive SAW filter has the same design, e.g. transducer design and separation, as the SAW filter in the active SAW filter.

An active SAW filter—including an acousto-electric amplifier having insertion gain—exhibits insertion gain or diminished insertion loss in comparison to the corresponding passive SAW filter. Particularly when the acousto-electric amplifier comprises resistive material which is a conductor, such as graphene, the noise figure of the acousto-electric amplifier should be low. Thus, when gain of the acousto-electric amplifier is sufficiently high, the noise figure of the active SAW filter is also low. If the active SAW filter—including an acousto-electric amplifier having insertion gain—exhibits insertion gain, an oscillator can be made by coupling an electrical output signal of the active SAW filter with a feedback loop to an input port of the active SAW filter such that the loop gain is greater than unity and the loop phase is an integer number of three hundred and sixty degrees, at a minimum of at least one frequency (achieved with a phase shift, e.g. inductor-capacitor, circuit). An active SAW filter—including an acousto-electric amplifier having insertion loss—exhibits increased insertion loss in comparison to the corresponding passive SAW filter. The loop is the electrical circuit formed by coupling the input port of the active SAW filter to the output port of the active SAW filter.

Resistive material, as used herein, means any material or device exhibiting resistivity. Material as used in this definition includes without limitation conductors, semiconductors, and conductive oxides (e.g. tin oxide, zinc oxide, and magnesium oxide). Device as used in this definition means a device configured to modulate carrier concentration in a channel and may include without limitation a metal-oxide-semiconductor device, a metal semiconductor device, a junction semiconductor device such as a junction field effect transistor or a heterojunction device such as a high electron mobility device. A device configured to modulate carrier concentration permits increasing, e.g. optimizing, gain of the acousto-electric amplifier while reducing direct current (DC) power consumption.

FIG. 1A illustrates a plan view of one embodiment of an active SAW filter including an acousto-electric amplifier having insertion gain (or active SAW filter) 100A. The active SAW filter 100A comprises a first transducer 104a, an acousto-electric amplifier having insertion gain 102, and a second transducer 104b. Optionally, each of the transducers 104a, 104b is implemented with interdigitated conductive fingers as described elsewhere herein. Interdigitated, as that term is used herein, means that a conductive finger of a first set of conductive fingers of a transducer is laterally displaced from (e.g. in parallel with) or between one or more conductive fingers of a second set of conductive fingers. Thus, as illustrated herein, a conductive finger of one set—interdigitated with a conductive finger of the second set—may or may not have an edge that directly opposes an edge of the conductive finger of the second set. The first transducer 104a, the second transducer 104b, and at least a portion, e.g. a set of conductive fingers 102+, of the acousto-electric amplifier having insertion gain 102 are formed on piezoelectric material 106.

Although FIG. 1A, illustrates a single first transducer 104a and a single second transducer 104b, each of the first transducer 104a and the second transducer 104b can be implemented by two or more transducer. Optionally, the ports of each set of two or more transducers may be electrically coupled. This applies to the other embodiments of transducer implementations illustrated herein.

The piezoelectric material 106 may be, for example, lithium niobite or quartz. An external power supply 108 is configured to be coupled to the acousto-electric amplifier having insertion gain 102 and to provide a direct current (DC) electric potential to the acousto-electric amplifier having insertion gain 102. A radio frequency choke may be inserted between the external power supply 108 and the acousto-electric amplifier having insertion gain 102. The external power supply is representative of a single DC supply voltage. The acousto-electric amplifier having insertion gain 102 comprises a resistive material 102' and a set of conductive fingers 102+.

As will be further explained subsequently, only a portion, e.g. the set of conductive fingers 102+ or the set of conductive fingers 102+ and optionally all or a portion of the resistive material 102', of the acousto-electric amplifier having insertion gain 102 may be in an acoustic beam width 107 between the first transducer 104a and the second transducer 104b. Unlike the prior art, the resistive material 102' covers no portion or only a small portion of a surface region of piezo-electric material through which the SAW travels, e.g. zero to 50 percent of such surface area.

However, in other embodiments, all of the acousto-electric amplifier having insertion gain 102 may be in the acoustic beam width 107 between the first transducer 104a and the second transducer 104b The acousto-electric amplifier having insertion gain 102 increases the amplitude of the electric potential, and thus the amplitude of the surface acoustic wave. Operation of the acousto-electric amplifier having insertion gain 102 will be subsequently described in further detail.

When an electrical signal is coupled to the first transducer 104a, the first transducer 104a transmits a surface acoustic wave 105 propagating towards the second transducer 104b. The SAW 105 is transmitted normal to a long width (in comparison to the narrow length) of the interdigitated conductive fingers of the first transducer 104a. The surface acoustic wave 105 propagates under a portion, e.g. the set of conductive fingers 102+, of the acousto-electric amplifier having insertion gain 102 and the amplitudes of the propagating mechanical wave and propagating electric potential of the SAW 105 are amplified. Note, however, the SAW 105 does not travel under resistive material 102' of the of the acousto-electric amplifier having insertion gain 102.

The surface acoustic wave 105 has a surface acoustic wave beam width ($W_{SAW}$) 107 that is substantially equal to a width of the first transducer 104a. The acoustic wave beam width means a width of the transverse wave emitted and received respectively by the first transducer 104a and the second transducer 104b, and sensed and amplified by the acousto-electric amplifier having insertion gain 102. In one embodiment, the width of the conductive fingers 102+ is substantially equal to the surface acoustic wave beam width 107. However, in alternative embodiments, the width of the conductive fingers of the set of conductive fingers 102+ may be different, e.g. less than the surface acoustic wave beam width 107.

The width of each of the conductive fingers of the set of conductive fingers 102+ may be different or equal. Also, the length of each of the conductive fingers of the set of conductive fingers 102+ may be different or equal. As subsequently illustrated, the length and width of the conductive fingers of a set of conductive fingers are respectively substantially perpendicular and substantially parallel to the surface acoustic wave beam width 107.

Wherever, the set of conductive fingers 102+ is coincident with the SAW 105, the SAW 105 is amplified. Thus, when the set conductive fingers 102+ covers the surface acoustic wave beam width 107, amplification of the SAW 105 is enhanced, e.g. maximized. Note, the set of conductive fingers 102+ must be coupled to the resistive material 102' as described elsewhere herein.

FIG. 1A illustrates an optional first reflector 101a and an optional second reflector 104b. The first reflector 101a reflects, towards the second transducer 101a, any surface acoustic waves transmitted by the first transducer 101a in a direction opposite to the second transducer 104b. The second reflector 101b reflects, towards the second transducer 101b any surface acoustic waves that are not initially coupled to the second transducer 101b and continue to propagate away from the second transducer 101b in a direction opposite from the first transducer 104a. The first reflector 101a and the second reflector 101b decrease the insertion loss of the passive portion of the active SAW filter 100A because more energy emitted from the first transducer 104a is coupled into the second transducer 104b.

Because it has a very small noise figure and reduced the insertion loss or insertion gain compared to comparable passive SAW filter, an active SAW filter—including an acousto-electric amplifier having insertion gain—can be used in a receiver, e.g., to increase sensitivity of the receiver. Increased sensitivity of a receiver results in increased range of reception of the receiver and thus increased signal coverage of a corresponding transmitter.

Figure 1B:
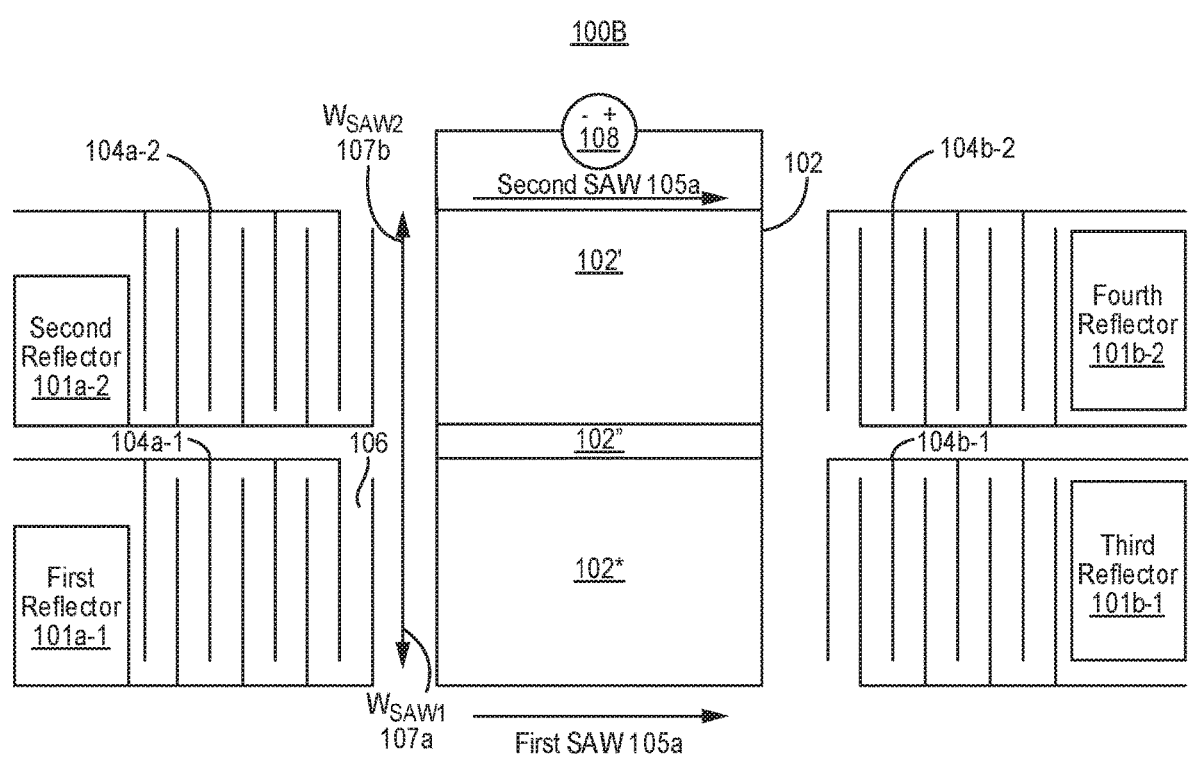
FIG. 1B illustrates a plan view of another embodiment of an active SAW filter including an acousto-electric amplifier having insertion gain.

More than one input transducer and more than one output transducer can be used with an electro-acoustic amplifier having insertion gain. FIG. 1B illustrates a plan view of another embodiment of an active SAW filter including an acousto-electric amplifier having insertion gain (or active SAW filter) 100B. Although only two input transducers and two output transducers are illustrated for pedagogical purposes, more input and output transducers can be utilized.

Each input transducer has an input electrical port. Each output transducer has an output electrical port. Two or more of the input transducers can have their input electrical ports electrically coupled. Two or more of the output transducers can have their output electrical ports electrically coupled.

The active SAW filter 100B comprises a first input transducer 104a-1 and a second input transducer 104a-2, an acousto-electric amplifier having insertion gain 102, a first output transducer 104b-1, and a second output transducer 104b-2.

When an electrical signal is coupled to the first input transducer 104a-1 and the second input transducer 104a-2, the first input transducer 104a-1 and the second input transducer 104a-2 respectively transmit a first surface acoustic wave 105a and a second surface acoustic wave 105b propagating respectively towards the first output transducer 104b-1 and the second output transducer 104b-2. The first SAW 105a and the second SAW 105b are transmitted normal to a long width (in comparison to the narrow length) of the interdigitated conductive fingers respectively of the first input transducer 104a and the second input transducer 104b. The first SAW 105a and the second SAW 105b propagate under portions, e.g. the first set of conductive fingers 102\* and the second set of conductive fingers **102\*\*, of the acousto-electric amplifier having insertion gain 102 and the amplitudes of the propagating mechanical wave and propagating electric potential of the SAW 105** are amplified.

The first SAW 105a and the second SAW respectively have a first surface acoustic wave beam width ($W_{SAW1}$) 107a and a second surface acoustic wave beam width ($W_{SAW2}$) 107b that are substantially equal to widths of respectively the first input transducer 101a-1 and the second input transducer 101a-2. FIG. 1B illustrates an optional first reflector 101a and an optional second reflector 101a-2 which each individually function like the first reflector 101a. The optional third reflector 101b-1 and the optional fourth reflector 101b-2 each individually function like the second reflector 101b.

The acousto-electric amplifier having insertion gain 102 comprises resistive material 102" and a first set of conductive fingers 102\* and a second set of conductive fingers **102\*\*. The first SAW 105a and the second SAW 105b do not travel under the resistive material 102" because the resistive material 102" is disposed between the first SAW 105a and the second SAW 105b. In one embodiment, the first set of conductive fingers 102\* and the second set of conductive fingers 102\*\* have widths substantially equal to respectively the first surface acoustic wave beam width 107a and the second surface acoustic wave beam width 107b. However, in alternative embodiments, the widths of one or both of the first set of conductive fingers 102\* and a second set of conductive fingers 102\*\*** may be different, e.g. and be less than the corresponding surface acoustic beam width.

Figure 1C:
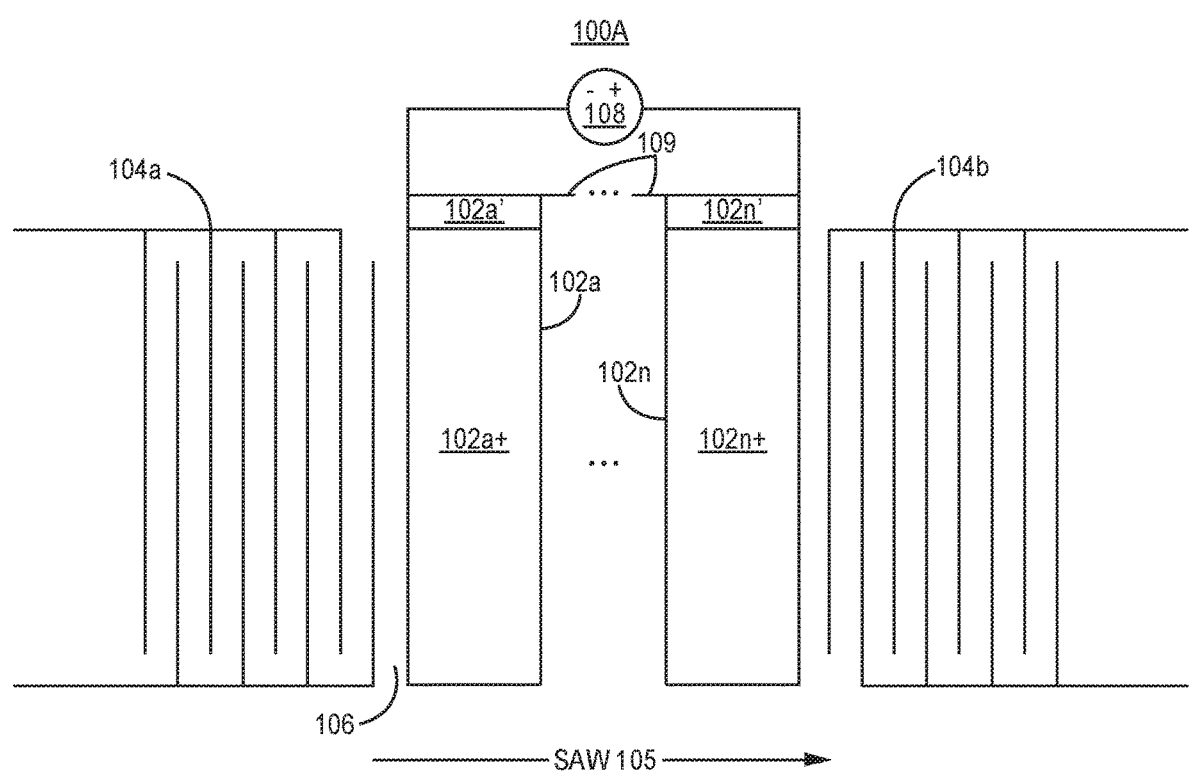
FIG. 1C illustrates a plan view of another embodiment of an active SAW filter including acousto-electric amplifiers each of which has insertion gain.

More than one electro-acoustic amplifier can be inserted in series in an active SAW filter between transducers. FIG. 1C illustrates a plan view of another embodiment of an active SAW filter including n acousto-electric amplifiers each of which has insertion gain 100C. The active SAW filter including n acousto-electric amplifiers each of which has insertion gain 100C is similar to the active SAW filter including acousto-electric amplifiers having insertion gain 100A except as subsequently described. This technique may be used in other embodiments disclosed herein.

Each acousto-electric amplifier having insertion gain 102a, 102n comprises resistive material 102a', 102n' coupled to at least one set of conductive fingers 102a+, 102n+. The acousto-electric amplifiers having insertion gain 102a, 102n may be implemented as illustrated in FIG. 1C and described with respect to FIG. 1A with a single set of conductive fingers 102a+, 102n+, or as illustrated in FIG. 1B with two sets of conductive fingers. If the former, then only one pair of transducers 104a, 104b is required. If the latter, then two pairs of transducers, as described with respect to FIG. 1B are required.

The n acousto-electric amplifiers each having insertion gain 102a, 102n are coupled in series. The external power supply 108 is coupled to the acousto-electric amplifiers upon which the surface acoustic wave is first and last incident, e.g. the first acousto-electric amplifier 102a and the nth acoustoelectric amplifier 102n. The external power supply 108 is serially coupled to the n acousto-electric amplifiers each having insertion gain 102a, 102n.

The transducers 104a, 104b and at least a portion of each acousto-electric amplifier are formed on the piezoelectric material 106. DC power is coupled between electro-acoustic amplifiers by conductors 109. The conductors 109 may include one or more types of conductor, such as a conductive line on a surface of the piezoelectric material 106, an air bridge, a via hole, a conductive line on a printed circuit board, solder (e.g. a solder ball), bond wire, and/or bond ribbon.

Serially coupling acousto-electric amplifiers can be used to increase insertion gain. If the designs of each of the n acousto-electric amplifiers is identical then the electric potential of the external power supply 108 will be equally distributed amongst the acousto-electric amplifiers. The illustrated acousto-electric amplifiers having insertion gain are coupled to individual external power supplies 108a, 108n. This reduces the voltage levels needed to be provided by a system using the active SAW filter including n acousto-electric amplifiers each of which has insertion gain 100D. Note, the individual external power supplies 108a, 108n are described for illustrative purposes. Two or more acousto-electric amplifiers having insertion gain 102a, 102n may be coupled to a single external power supply in parallel rather than in series as illustrated in FIG. 1C.

When an electrical signal is coupled, e.g., to the first transducer 104a, a surface acoustic wave 105 propagates towards the second transducer, e.g. normal to the interdigitated conductive fingers illustrated in the first transducer 104a. The surface acoustic wave 105 propagates under a portion of each of the acousto-electric amplifiers 102a . . . n, and the amplitude of the corresponding propagating mechanical wave and propagating electric potential are amplified. Each acousto-electric amplifier having insertion gain 102a, 102n includes resistive material 102a', 102n' which function as described elsewhere herein.

Figure 1D:
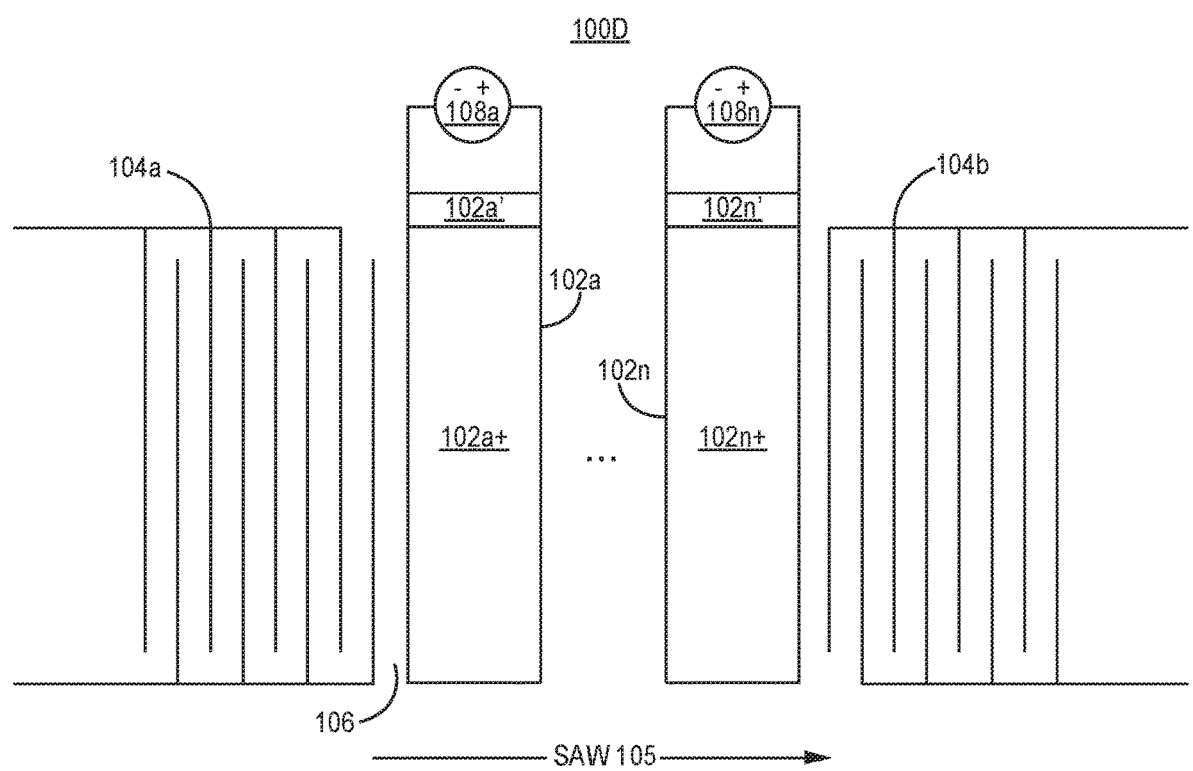
FIG. 1D illustrates a plan view of another embodiment of an active SAW filter including n acousto-electric amplifiers each of which has insertion gain.

FIG. 1D illustrates a plan view of another embodiment of an active SAW filter including n acousto-electric amplifiers each of which has insertion gain 100D. The active SAW filter including n acousto-electric amplifiers each of which has insertion gain 100D may be implemented in a manner similar to the active SAW filter including n acousto-electric amplifiers each of which has insertion gain 100C of FIG. 1C. However, each of the acousto-electric amplifiers having insertion gain is coupled to a unique DC supply voltage represented for illustrative purposes by an external power supply 108a, 108n. This reduces the voltage levels needed to be provided by a system using the active SAW filter including n acousto-electric amplifiers each of which has insertion gain 100D. Note, two or more acousto-electric amplifiers having insertion gain 102a, 102n may be coupled to a single external power supply in parallel rather than in series as illustrated in FIG. 1C. In other embodiments, the acousto-electric amplifiers having insertion gain 102a, 102n may be coupled to DC supply voltages both in series and in parallel, mixing the embodiments disclosed for FIGS. 1C and 1D. Such techniques may be used in other embodiments disclosed herein.

Figure 2:
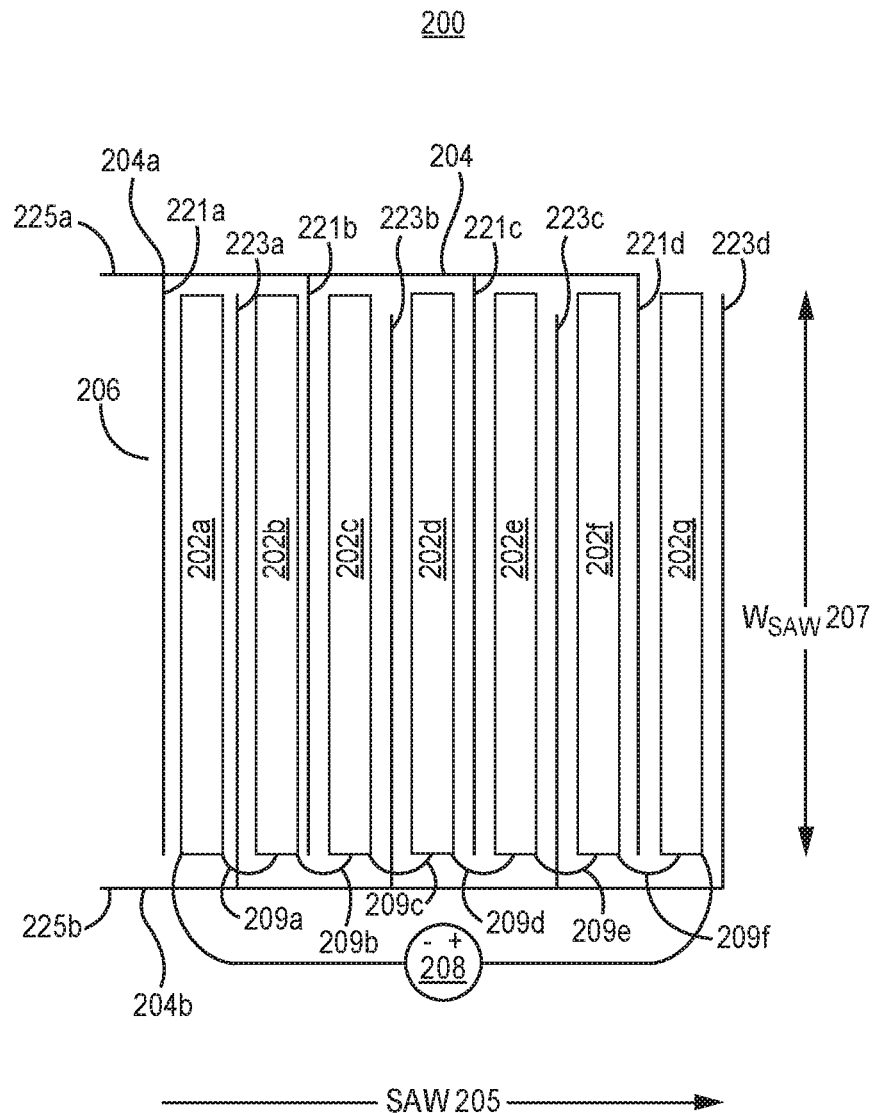
FIG. 2 illustrates a plan view of one embodiment of an active transducer.

In other embodiments, electro-acoustic amplifier(s) need not be or exclusively be inserted between transducers. FIG. 2 illustrates a plan view of one embodiment of an active transducer 200. The active transducer 200 amplifies the surface acoustic wave transmitted or received by the active transducer 200. The active transducer 200 comprises a passive transducer 204 and at least one acousto-electric amplifier. The passive transducer 204 comprises a first set of conductive fingers 204a and a second set of conductive fingers 204b. At least one acousto-electric amplifier is inserted between a finger of each set of conductive fingers of an active transducer 200. More than one acoustic-electric amplifier may be inserted between such fingers in a manner described with respect to FIGS. 1C and 1D. For pedagogical purposes, FIG. 2 illustrates seven acousto-electric amplifiers 202a, 202b, 202c, 202d, 202e, 202f, 202g inserted between each of seven pairs of conductive fingers of the first set 204a and the second set 204b. Thus, the active transducer may include one or more acousto-electric amplifiers. Each acousto-electric amplifier is between one conductive finger of a first set and one conductive finger of the second set.

The passive transducer 204 and at least a portion of each acousto-electric amplifier are formed on a surface of the piezoelectric material 206. As discussed herein, all or part of the acousto-electric amplifier may be formed on the surface of the piezoelectric material.

When an electrical signal is coupled, e.g., to the active transducer 200, a surface acoustic wave 205 is generated within the active transducer 200, and transmitted from the active transducer 200, e.g. normal to the interdigitated conductive fingers. As it is generated, the surface acoustic wave 205 propagates under a portion of each of the acousto-electric amplifiers 102a . . . n, and the amplitude of the corresponding travelling electric potential is amplified.

The first set of conductive fingers 204a of the passive transducer 204 is formed by conductive fingers 221a, 221b, 221c, 221d coupled by a first common conductor 225a. The second set of conductive fingers 204b of the passive transducer 204 is formed by conductive fingers 223a, 223b, 223c, 223d coupled by a second common conductor 225b. The first set 204a is interdigitated with the second set 204b.

An external power supply 208 is coupled to the acousto-electric amplifiers in the active transducer 200. The external power supply 208 is representative of a single DC supply voltage. If there is more than one set of conductive fingers with one or more acousto-electric amplifiers between conductive fingers of each set, then a set of one or more acousto-electric amplifiers between each set of conductive fingers are coupled in the manner illustrated in FIG. 2A. Conductors 209a, 209b, 209c, 209d, 209e, 209f couple an electric potential applied by an external power supply 208 to each of the acousto-electric amplifiers. Alternatively, more than one external power supplies (or DC supply voltages) which may be coupled as described above (in parallel and/or in series) with respect to FIG. 1D. For purposes of clarity, the active transducer 200 can be used in place of one or both passive transducers illustrated in FIGS. 1A and 1B.

Prior acousto-electric amplifiers (exhibiting insertion loss) have been formed with a layer of a conductor or a semiconductor disposed on or over the surface—of the piezoelectric material between the transducers—on which the surface acoustic wave travels. In the absence of an electric potential applied across the ends of the layer, where the surface acoustic wave commences and exits travel under the layer, majority carriers circulate through the layer. Majority carriers (electrons or holes) travel in the same direction as the surface acoustic wave travels due to moving potential wells in the layer induced by moving electric field of the surface acoustic wave. The term induced means caused as—used herein. Majority carriers bunch at the end of the layer where the surface acoustic wave exits travel under the layer. A corresponding current, induced by the electric potential, flows in the direction of travel of the SAW when the majority carriers are holes, and in a direction opposite of the direction of travel of the SAW when the majority carriers are electrons. The resulting potential from such majority carrier bunching induces a restoring current that flows in the opposite direction of the current induced by the electric potential. This circulating current dissipating electrical energy due to resistive losses, correspondingly diminishes the energy of the surface acoustic wave, and thus increases insertion loss of the SAW filter.

When the majority carriers are electrons and upon applying a electric field (across ends of the resistive material in an opposite direction of travel of the surface acoustic wave and electron flow) having a potential sufficient to cause a magnitude of current flow (in the opposite direction as the surface acoustic wave and the electron flow) to be greater than the restoring current flowing in the opposing direction, then the energy of the electrons in the resistive material is decreased. As a result, the amplitude of the propagating electric potential of the surface acoustic wave is increased.

However, energy and potential losses in the surface acoustic wave arise from the layer diminishing the elasticity of the piezoelectric material and impedance mismatches between the piezoelectric material and that layer. The diminished elasticity attenuates the amplitude of the surface acoustic wave and its corresponding electric field. The impedance mismatch reduces the energy conveyed between the piezoelectric material and the layer. Such losses have caused prior acousto-electric amplifiers to exhibit insertion loss rather than insertion gain.

Figure 3A:
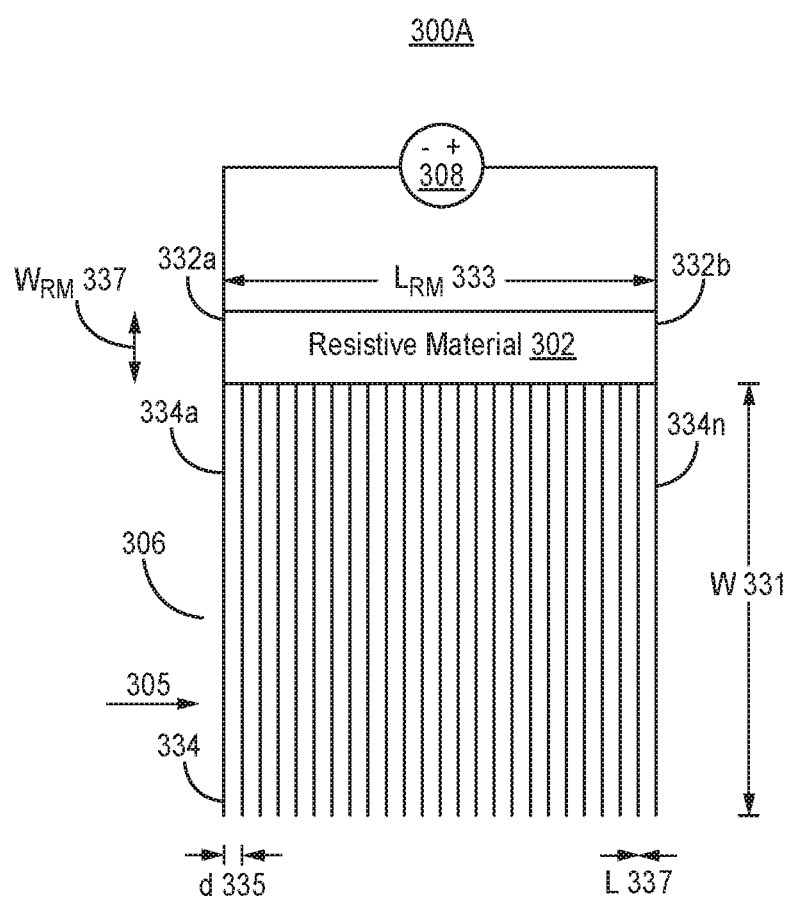
FIG. 3A illustrates a plan view of one embodiment of an acousto-electric amplifier having insertion gain.

An exemplary design of an acousto-electric amplifier having insertion gain will now be described. FIG. 3A illustrates a plan view of one embodiment of an acousto-electric amplifier having insertion gain 300A. The acousto-electric amplifier having insertion gain 300A is suitable for use in the active SAW filter including an acousto-electric amplifier having insertion gain 100A illustrated in FIG. 1A.

The acousto-electric amplifier having insertion gain 300A comprises resistive material 302, e.g. graphene, coupled to a set of conductors (or conductive fingers) 334. The set of conductive fingers comprises two or more conductors (or conductive fingers) 334a, 334n used to sense and—in part—amplify the propagating electric potential of the surface acoustic wave 305. The resistive material 302 has a high resistance so that the conductive fingers are not shorted to one another.

A DC potential is configured to be coupled to a first end 302a and a second end 302b of the resistive material 302. The DC potential is illustrated for pedagogical purposes by an external power supply 308. However, the DC potential may be a DC supply voltage, or a DC potential created by serially coupling the acousto-electric amplifier having insertion gain 300 to other coupled acousto-electric amplifiers having insertion gain; these embodiments have been discussed elsewhere herein. The external power supply 308 provides a DC potential across the first end 302a and the second end 302a of the resistive material 302. Typically, the DC potential may be greater than 100V, e.g. 160V. This voltage is high, and may not be found in typical systems that may benefit from an acousto-electric amplifier having insertion gain 300, e.g. a mobile phone. By cascading multiple acousto-electric amplifiers having insertion gain 300 in series, e.g. as shown in FIGS. 1B and 2, the electric potential required at each acousto-electric amplifier having insertion gain 300A is reduced by the number of acousto-electric amplifier having insertion gain 300 which are in series. Thus, in other embodiments, each acousto-electric amplifier having insertion gain illustrated in FIGS. 1B and 2 may be configured to be coupled more than one DC supply voltage in parallel and/or in series.

The conductive fingers are formed on a surface of the piezoelectric material 306 coincident with the surface region of the piezoelectric material in which the surface wave 305 travels. In one embodiment, the width (W) 331 of the conductive fingers is equal to the surface acoustic wave beam width ($W_{SAW}$) 107 of the surface acoustic wave 305. Having the width 331 of the conductive fingers equal to the surface acoustic beam width 107 desirably increases the coupling between the surface acoustic wave 305 and the resistive material 302, and increases the insertion gain of the acousto-electric amplifier having insertion gain 300.

The length (L) 337 of each conductive finger and the spacing (d) 335 between adjacent conductive fingers are each small, e.g. as small as permitted by the corresponding manufacturing process, to enhance bandwidth of the acousto-electric amplifier. Diminishing the length of the conductive fingers and the spacing between conductive fingers desirably enhances the number of samples of the travelling electrical potential on the surface of the piezoelectric material 306 between the surface acoustic wave 305 and the resistive material 302, and increases the insertion gain of the acousto-electric amplifier having insertion gain 300. For example, the length 337 may be 2 um or smaller, and the spacing 335 may be 2 um or smaller. The length 337 and spacing 335 of the conductive fingers do not significantly diminish the elasticity of the surface of the piezoelectric material on which the surface acoustic wave 305 travels.

The conductive fingers illustrated in FIG. 3A are for pedagogical purposes and an acousto-electric amplifier having insertion gain would have more conductive fingers than illustrated. The number of conductive fingers 334a, 334b of the set of conductive fingers 334 must be sufficient to form potential wells in the resistive material 302. For example, there must be more than three or four conductive fingers per λ, where λ is the wavelength of the surface acoustic wave 305.

The resistive material 302 is formed, e.g. on or above the surface of the piezoelectric material 306 or on another surface of another material, outside of the surface acoustic wave beam width 107 to avoid diminishing elasticity of the piezoelectric material in which the surface acoustic wave 305 travels. The resistive material 302 be formed by one or more of epitaxial, deposition, and bonding (e.g. wafer bonding) techniques used in the semiconductor industry. The resistive material 302 may be a thin film, a substrate, or may have another form.

The resistive material 302 has a length ($L_{RM}$) 333 and a width ($W_{RM}$) 337. The resistive material 302 can be formed from a conductor or semiconductor (e.g. a conductor or semiconductor having high mobility such as graphene, gold, or silver). A conductor or semiconductor having a single crystal structure, for example, may be used to obtain a high carrier mobility and a low carrier concentration to obtain a low sheet resistivity. High carrier mobility is desirable because then a lower electric field, and thus a lower DC potential, may be used to generate insertion gain in the acousto-electric amplifier. Lower DC potentials are also preferable because they are readily available in systems that would employ an acousto-electric amplifier having insertion gain. However, it is desirable to have a corresponding low carrier concentration so that the sheet resistivity of the resistive material 302 is high. Having a high sheet resistivity of the resistive material 302 makes it easier to match the sheet resistivity of the resistive material 302 to the sheet impedance of the piezoelectric material to obtain higher power transfer between the two materials.

The theory of operation of an acousto-electric amplifier having insertion gain follows. The travelling electric potential generates a constant electric potential over a conductive finger. As long as the number of conductive fingers is sufficient, and the conductive finger lengths and spacings are sufficiently smaller than the wavelength of the surface acoustic wave 305, the conductive fingers accurately sense (i.e. sample) the time varying propagating electric potential of the surface acoustic wave 305. A discrete electric potential sensed at an instant is conveyed to a different portion of a sidewall of the resistive material 302 by each conductive finger. The electric potential conveyed by each conductive finger corresponds to energy levels. The energy levels vary amongst at least some of the conductive fingers to create energy wells in the resistive material 302. The energy wells travel in the resistive material 302 in the same direction as the surface acoustic wave 305 travels in the piezoelectric material 306. Charge collects in the energy wells and is displaced with the energy wells. By applying an electric potential across the first end 302a and a second end 302b of the resistive material 302, added carriers are conveyed in the energy wells in the same direction as surface acoustic wave 305 travels. Energy is transferred from the added carriers, induced by the electric potential, to the surface acoustic wave 305 through the set of conductive fingers 334. The transferred energy increases the amplitude of the propagating mechanical wave and the propagating electric potential of the surface acoustic wave 305.

The gain (or loss) of an acousto-electric amplifier is an exponentially related to a propagation constant for the direction of travel of the corresponding surface acoustic wave: $G=G_0 * e^{-f(\alpha)}$, where $G_0$ is a constant, G is the gain (or loss) of the acousto-electric amplifier in one direction of travel of the surface acoustic wave, $f(\alpha)$ is a function of $\alpha$, and $\alpha$ is the propagation constant for the same direction of travel of the surface acoustic wave. To obtain insertion gain, it is desirable to generate a large, e.g. maximal, negative value of $\alpha$ and $f(\alpha)$.

$\alpha$ equals $(2*\pi/\lambda) (\kappa^2/2)(x/(1+x^2))$, where x equals $(R_s/Z_{SAW})*(W_{SAW}/W_{RM})*((\upsilon_{saw}-\upsilon_c/\upsilon_{SAW})$, $W_{SAW}$ is the surface acoustic wave beam width, $W_{RM}$ is a width of the resistive material, $R_s$ is a sheet resistance of the resistive material in ohms per square, $Z_{SAW}$ is a sheet impedance of the piezoelectric substrate per square and is equal to $1/(\epsilon * \upsilon_{SAW})$, $\upsilon_{SAW}$ is a propagation velocity of the piezoelectric substrate and is known for many piezoelectric materials, $\upsilon_v$ is a carrier drift velocity in the resistive material 302, c is a dielectric constant of the piezoelectric substrate, $\kappa^2$ is a coupling coefficient of the piezoelectric material and describes how efficiently a mechanical surface acoustic wave generates the corresponding travelling electric field. $Z_{SAW}$, for example, may be between 0.25 and 1.5 MΩ, e.g. 0.49 MΩ for 128 degree Y cut lithium niobate. $R_s$ is about 5 kΩ/square for graphene.

$\alpha$ is large, e.g. maximum, when $(R_s/Z_{SAW})*(W_{SAW}/W_{RM})*((\upsilon_{SAW}-\upsilon_x)/\upsilon_{SAW})$ substantially equals minus one, $-1$ (or $(R_s/Z_{SAW})*(W_{SAW}/W_{RM})*(1-(\upsilon_c/\upsilon_{SAW}))\approx -1$. $\upsilon_c=\mu*E$, where $\mu$ is carrier mobility of the resistive material 302, and E is applied electric field across the resistive material 302. This equation for $\alpha$ accounts for matching the impedance of the piezoelectric material 306 with the resistance of the resistive material 302 to ensure maximum power transfer between the piezoelectric material 306 and the resistive material 302.

Thus, for $(R_s/Z_{SAW})*(W_{SAW}/W_{RM})*(1-((\mu*E)/\upsilon_{SAW}))\approx -1$, the product of the carrier mobility and the applied electric field must be larger than $\upsilon_{SAW}$ (i.e. the carrier drift velocity must be greater than the SAW velocity). $R_s$ and $\mu$ are known for a selected resistive material 302. $Z_{SAW}$ and $\upsilon_{SAW}$ are known a selected piezoelectric material 306. Thus, to make an acousto-electric amplifier having high, e.g. maximum, insertion gain, an electric field E (or a corresponding electric potential) across the resistive material 302) can be selected by adjusting the ratio $W_{RM}/W_{SAW}$, where $E\approx(\upsilon_{SAW}/\mu) (1+(Z_{SAW}/R_s)*(W_{RM}/W_{SAW}))$.

Figure 3B:
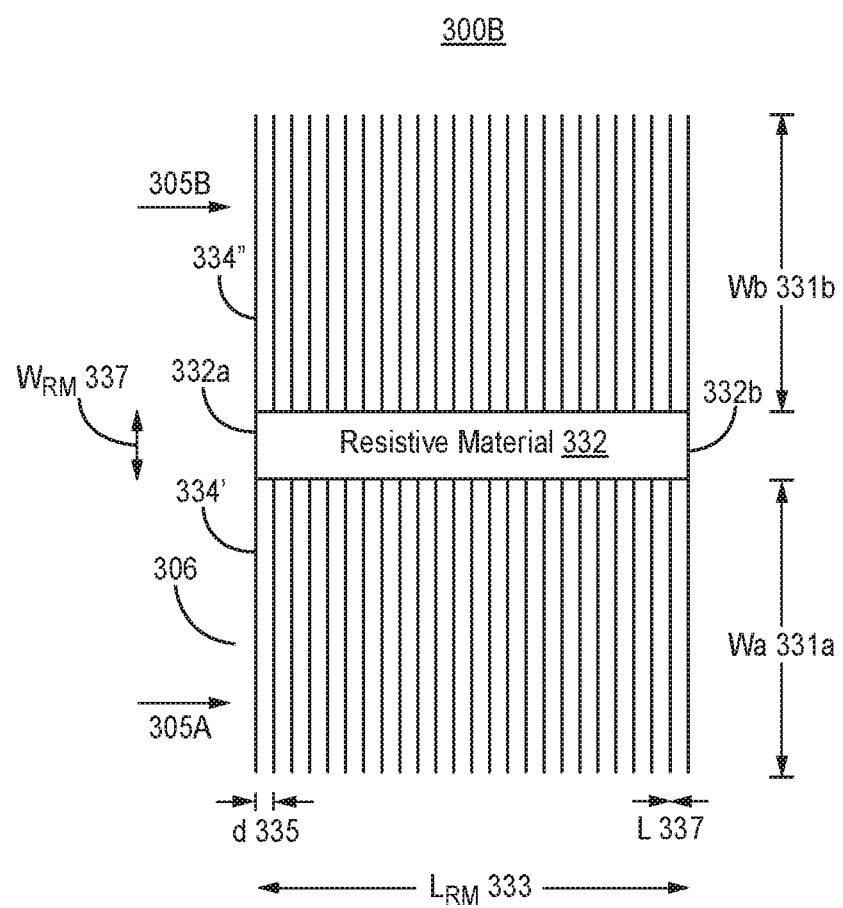
FIG. 3B illustrates a plan view of another embodiment of an acousto-electric amplifier having insertion gain.

FIG. 3B illustrates a plan view of another embodiment of an acousto-electric amplifier having insertion gain 300B. The embodiment of an acousto-electric amplifier having insertion gain 300B illustrated in FIG. 3B can be used in the embodiment of the active SAW filter 100B illustrated in FIG. 1B. The acousto-electric amplifier having insertion gain 300B illustrated in FIG. 3B is similar to the acousto-electric amplifier having insertion gain 300A illustrated in FIG. 3A, except that the embodiment illustrated in FIG. 3B is configured to receive two surface acoustic waves 305A, 305B. To sense and amplify the propagating electric potential of each of the two surface acoustic waves 305A, 305B, the acousto-electric amplifier having insertion gain 300B includes a first set of conductive fingers 334' and a second set of conductive fingers 334" coupled to the resistive material. The first set of conductive fingers 334' has a first width $W_a$ 331a. The second set of conductive fingers 334' has a second width $W_b$ 331b. The first width $W_a$ 331a may, or may not, equal the second width $W_b$ 331b. Similarly, the length of the first set of conductive fingers 334' may, or may not, equal the length of the second set of conductive fingers 334". For pedagogical purposes, the first width $W_a$ 331a is illustrated as being equal to the second width $W_b$ 331b, and both lengths are illustrated as being equal to $L_{RM}$ 333. Because the width of the conductive fingers, coupled to the resistive material 332, is increased, e.g. doubled, the gain provided by the acousto-electric amplifier having insertion gain 300B is correspondingly increased. Although not shown, a supply voltage configured to be coupled to the resistive material 332 as described with respect to FIG. 3A.

In another embodiment, an acousto-electric sensor can be made using one or more of the techniques described herein. The resistive material would be replaced with a material that is sensitive to a change in environmental parameter(s). For example, the resistive material can be made from nano-clusters of palladium whose resistance changes with changes of concentration of hydrogen to which the palladium is exposed. The external supply voltage may or may not be used. The acousto-electric sensor would have increased sensitivity to changes in the environmental parameters due to the sensor having insertion gain or reduced insertion loss.

Figure 3C:
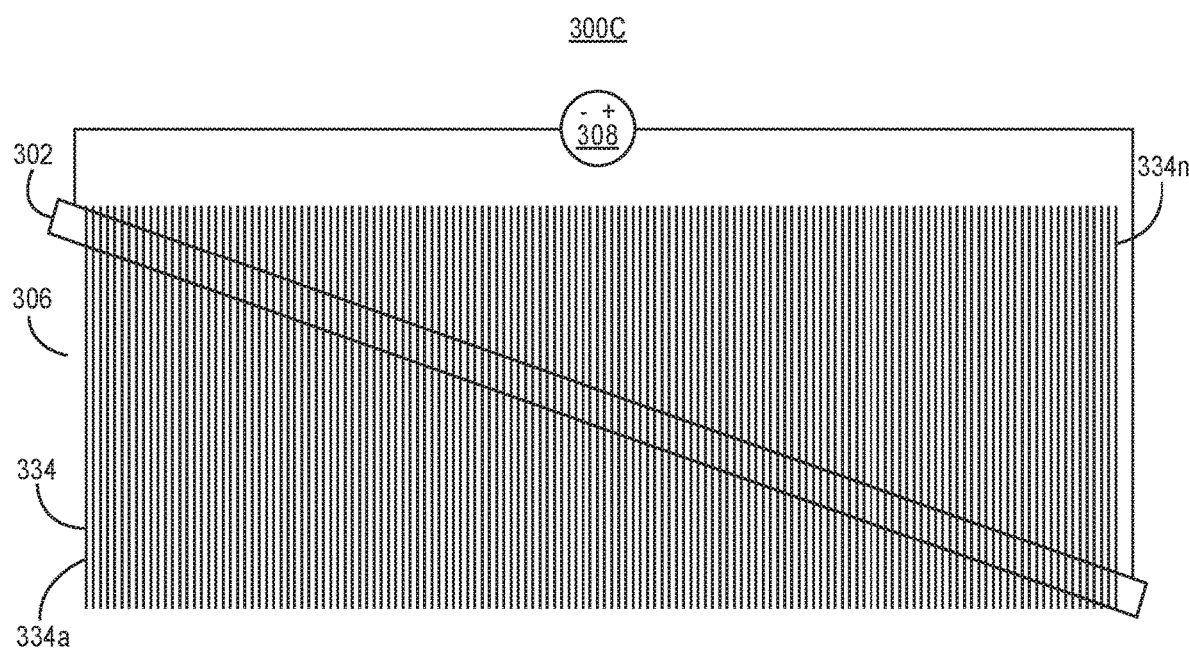
FIG. 3C illustrates a plan view of another embodiment of an active transducer.

Although the length ($L_{RM}$) 333 resistive material has been illustrated as being perpendicular (or orthogonal) to the width (W) 331 of the conductive fingers of an acousto-electric amplifier, other implementations are feasible. FIG. 3C illustrates a plan view of another embodiment of an acousto-electric amplifier having insertion gain 300C. The resistive material 302 is placed at a non-orthogonal angle with respect to the width of the conductive fingers of the acousto-electric amplifier. In the illustrated embodiment, the non-orthogonal angle is defined by an upper corner and lower corner on opposite sides of the set of conductive fingers 334 of the acousto-electric amplifier having insertion gain 300C.

The set of conductive fingers 334 may be on the surface of the piezoelectric material 306; the resistive material 302 would be disposed above the set of conductive fingers 334 and contact the set of conductive fingers 304 where the set 334 and the resistive material overlap. The resistive material 302 may or may not be disposed on the surface of the piezoelectric material 306 between conductive fingers of the set of conductive fingers 334.

Alternatively, the resistive material 302 can be disposed on the surface of piezoelectric material 306. The set of conductive fingers 334 may be disposed over the resistive material 302 so that one portion of the set of conductive fingers 334 is on the surface of the piezoelectric material and a second portion of the set conductive fingers 334 is on a surface of the resistive material 302.

The ends of the resistive material 302 terminate about such upper and lower corners. One or both ends of the resistive material 302, however, need not terminate about such a corner, but at another location on a corresponding side of the set of conductors 334. The non-orthogonal embodiment may be used in any of the embodiments discussed herein and potentially other embodiments.

Figure 3D:
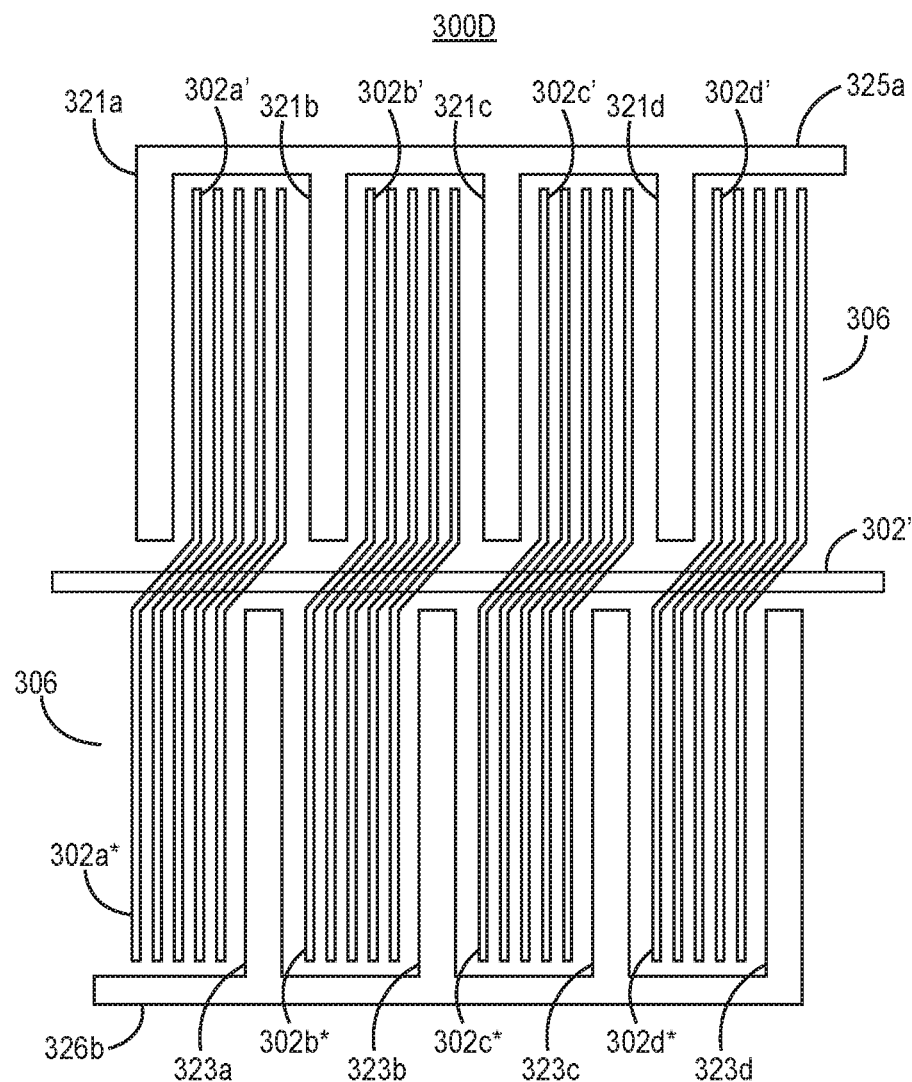
FIG. 3D illustrates a plan view of another embodiment of an active transducer.

Another embodiment of an active transducer—where the acousto-electric amplifiers including conductive fingers—will now be described. FIG. 3D illustrates a plan view of another embodiment of an active transducer 300D. The active transducer 300D comprises a passive transducer 304 and at least one acousto-electric amplifier. The passive transducer 304 and the at least one acousto-electric amplifier are formed on a surface of the piezoelectric material 306.

The passive transducer 304 comprises a first set of conductive fingers 304a and a second set of conductive fingers 304b. The first set of conductive fingers 304a (comprising conductive fingers 321a, 321b, 321c, 321d coupled by a first common conductor 325a) is interdigitated with the second set 304b (comprising conductive fingers 323a, 323b, 323c, 323d coupled by a second common conductor 325b). However, the conductive fingers of the first set 304a do not have edges directly opposing an edge of the conductive fingers of the second set 304b because the edges are offset from one another. This allows common resistive material 302' to be inserted between the ends of the conductive fingers of the first set 304a and the conductive fingers of the second set 204b. Eight sets of acousto-electric amplifier conductive fingers 302a*, 302a', 302b*, 302b', 302c*, 302c', 302d*, 302d' are coupled to the resistive material 302'. Each set of acousto-electric amplifier conductive finger coupled to the resistive material 302' forms a discrete acousto-electric amplifier. An electric potential can be applied across each end—of the resistive material 302'—which, e.g., protrude from the passive transducer 304. Where the resistive material 302' and the sets of acousto-electric amplifier conductive fingers 302a*, 302a', 302b*, 302b', 302c*, 302c', 302d*, 302d' overlap, the resistive material 302' can be above or below the sets of acousto-electric amplifier conductive fingers 302a*, 302a', 302b*, 302b', 302c*, 302c', 302d*, 302d' in a manner, e.g. described above for FIG. 3C.

Figure 4:
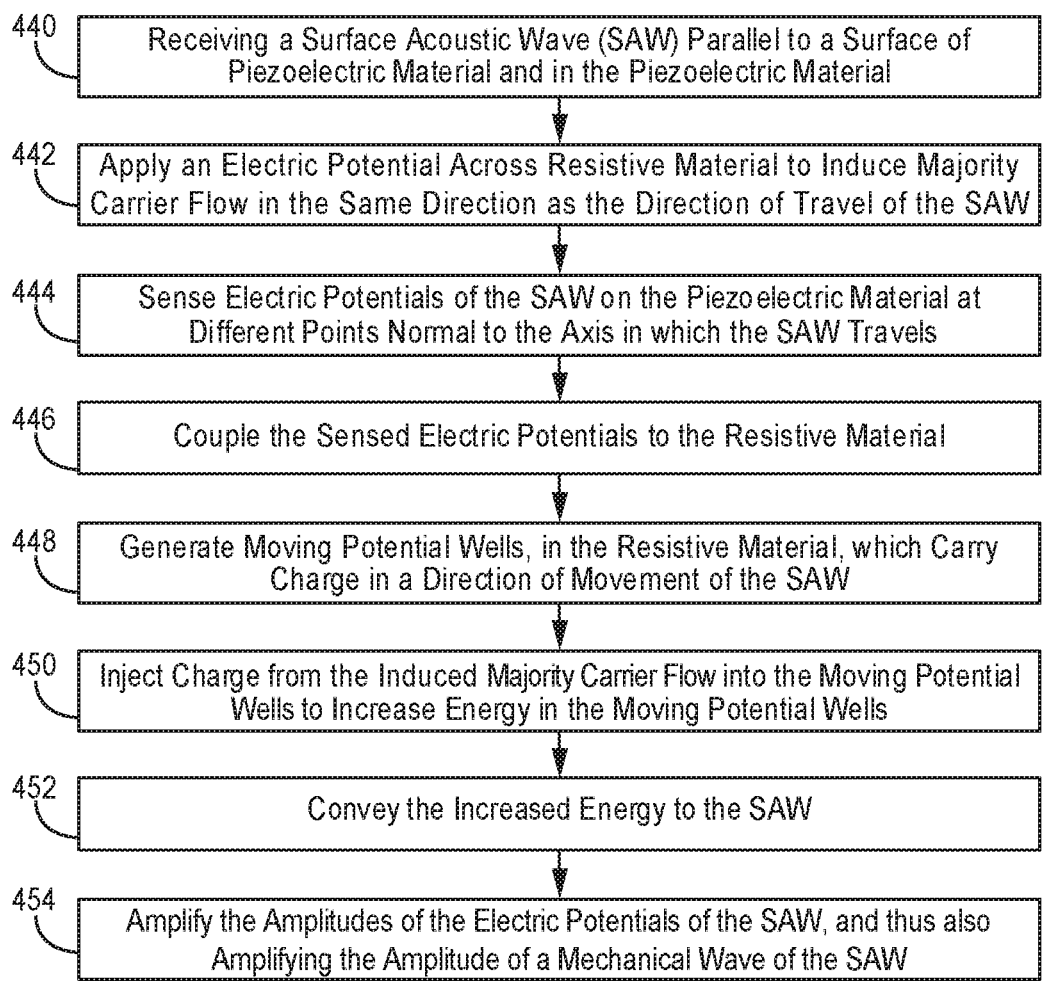
FIG. 4 illustrates an exemplary method of operation of an electro-acoustic amplifier

FIG. 4 illustrates an exemplary method of operation of an electro-acoustic amplifier 400. To the extent the method 400 shown in FIG. 4 is described herein as being implemented in the devices shown in FIGS. 1A through 3D, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 440, receiving a surface acoustic wave parallel to a surface of piezoelectric material and in the piezoelectric material. Optional, this block includes transmitting, e.g. from a first transducer, the surface acoustic wave which is then received. In block 442, apply an electric potential across resistive material to induce majority carrier flow in the resistive material, wherein the majority carrier's flow in the same direction as the direction of travel of the surface acoustic wave. The drift velocity of the majority carriers is greater than a velocity of the surface acoustic wave in the piezoelectric. The impedance of the piezoelectric material is substantially matched to the resistance of the resistive material to enhance power transfer between the resistive material and the piezoelectric material. In one embodiment, the resistive material is not disposed on the surface of the piezo-electric material within the beam width of the surface acoustic wave. However, in other embodiments, at least part of the resistive material is disposed on and/or above the surface of the piezo-electric material within the beam width of the surface acoustic wave.

In block 444, sense, in the beam width, propagating electric potentials of the surface acoustic wave on the piezoelectric material at different points normal to the axis in which the surface acoustic wave travels. The propagating mechanical wave and the propagating electric potentials of the surface acoustic wave have initial amplitudes when sensing is performed. The electric potentials travelling with the surface acoustic wave have an initial amplitude when sensing is performed.

In block 446, couple the sensed electric potentials to the resistive material. In block 448, generate moving potential wells, in the resistive material, which carry charge in a direction of the movement of the surface acoustic wave. In block 450, inject charge from induced majority carrier flow into the moving potential wells to increase energy in the moving potential wells. Thus, the injected charge also moves in the direction of the surface acoustic wave.

In block 452, conveying, e.g. with the conductive fingers of an acousto-electric amplifier, the increased energy in the moving potential wells to the surface acoustic wave. In block 454, upon receiving the increased energy, increase the amplitude of the propagating electric potential of the surface acoustic wave so that it is larger than the sensed initial amplitude of a propagating electric potential of the surface acoustic wave. If the amplitude of the propagating electric potential of the surface acoustic wave is increased, then the amplitude of a propagating mechanical wave of the surface acoustic wave is also increased so that it is larger than the initial amplitude of the surface acoustic wave. Hence, the surface acoustic wave is amplified. Optionally, transmit the amplified surface acoustic wave to a second transducer, and thus receive the amplified surface acoustic wave at the second transducer. Optionally, electrically couple an electrical signal generated by the second transducer from the received amplified SAW to the first transducer, where, at at least one frequency, a gain of the electrical loop circuit formed by such coupling is greater than unity and a phase of the electrical loop circuit is an integer number of three hundred and sixty degrees.

Exemplary Embodiments

Example 1 includes a method, comprising: receiving a surface acoustic wave (SAW) propagating parallel to a surface of a piezoelectric material and in the piezoelectric material; applying an electric potential across resistive material to induce majority carrier flow in the resistive material in a same direction as a direction of travel of the SAW, where the majority carriers have a carrier drift velocity greater than a velocity of the SAW in the piezoelectric material; sensing, in the beam width, electric potentials of the SAW in the piezoelectric material at different points normal to the axis in which the SAW travels; coupling the sensed electric potentials to the resistive material; generate moving potential wells, in the resistive material, which carry charge in a direction of movement of the SAW; injecting charge from the induced majority carrier flow into the moving potential wells to increase energy stored in the moving potential wells; conveying the increased energy to the SAW; and amplifying amplitudes of the electric potentials of the SAW, and thus also amplifying an amplitude of a mechanical wave of the SAW.

Example 2 includes the method of Example 1, wherein the resistive material is not disposed on the surface of the piezo-electric material within the beam width of the SAW.

Example 3 includes the method of any of Examples 1-2, further comprising: transmitting the SAW from a first transducer comprising a first electrical port; and receiving the amplified SAW at a second transducer comprising a second electrical port.

Example 4 includes the method of Example 3, further comprising electrically coupling an electrical signal, generated by the second transducer from the received amplified SAW, to the first transducer, where, at at least one frequency, a gain of an electrical loop circuit formed by such coupling is greater than unity and a phase of the electrical loop circuit is an integer number of three hundred and sixty degrees.

Example 5 includes an apparatus, comprising: a resistive material configured to have an electric potential applied across resistive material to induce majority carrier flow in the resistive material in a same direction as a direction of travel of a surface acoustic wave (SAW), where the majority carriers have a carrier drift velocity greater than a velocity of the SAW in the piezoelectric material; sensors configured to sense, in the beam width, electric potentials of the SAW on the piezoelectric material at different points normal to the axis in which the SAW travels; where the sensors are coupled to the resistive material and are further configured to couple the sensed electric potentials to the resistive material to generate moving potential wells, in the resistive material, which carry charge in a direction of movement of the SAW; wherein charge from the induced majority carrier flow is injected into the moving potential wells to increase energy in the moving potential wells; and wherein the sensors are further configured to convey the increase energy to the SAW so as to amplify amplifying amplitudes of the electric potentials of the SAW, and thus also amplifying an amplitude of a mechanical wave of the SAW.

Example 6 includes the apparatus of Example 5, wherein the resistive material is not disposed on the surface of the piezo-electric material within the beam width of the SAW.

Example 7 includes the apparatus of any of Examples 5-6, wherein the resistive material is disposed at a non-orthogonal angle with respect to a width of the sensors.

Example 8 includes the apparatus of any of Examples 5-7, further comprising: at least one input transducer formed on the piezoelectric material and each of which is configured to transmit a SAW; and at least one output transducer formed on the piezoelectric material and each of which is configured to receive a SAW having amplified amplitudes of the electric potentials and the mechanical wave.

Example 9 includes the apparatus of Example 8, wherein the at least one input transducer has a first electrical port configured to receive an electrical signal; wherein the at least one output transducer has a second electrical port configured to transmit an electrical signal; wherein an electrical signal, is generated by the at least one output transducer at the second electrical port from the received amplified SAW; and wherein the first electrical port is coupled to the second electrical port, where at at least one frequency, a gain of an electrical loop circuit formed by such coupling is greater than unity and a phase of the electrical loop circuit is an integer number of three hundred and sixty degrees.

Example 10 includes an apparatus, comprising: resistive material configured to have an electric potential applied across the resistive material; at least one set of conductive fingers coupled to the resistive material and formed on the surface of the piezo-electric material in the beam width of a surface acoustic wave (SAW); wherein the electric potential is configured to induce majority carrier flow in the resistive material in a same direction as a direction of travel of the SAW, where the majority carriers have a carrier drift velocity greater than a velocity of the SAW in the piezoelectric material; and wherein the resistive material and the at least one set of conductive fingers are configured to convey energy to the SAW to amplify amplitudes of the electric potentials of the SAW, and thus also amplify an amplitude of a mechanical wave of the SAW.

Example 11 includes the apparatus of Example 10, wherein the resistive material is not disposed on the surface of the piezo-electric material within the beam width of the SAW.

Example 12 includes the apparatus of any of Examples 10-11, wherein the resistive material is disposed at a non-orthogonal angle with respect to a width of the at least one set of conductive fingers.

Example 13 includes the apparatus of any of Examples 10-12, further comprising: at least one input transducer formed on the piezoelectric material and each of which is configured to transmit a SAW; and at least one output transducer formed on the piezoelectric material and each of which is configured to receive a SAW having amplified amplitudes of the electric potentials and the mechanical wave.

Example 14 includes the apparatus of Example 13, wherein the at least one input transducer has a first electrical port configured to receive an electrical signal; wherein the at least one output transducer has a second electrical port configured to transmit an electrical signal; wherein an electrical signal, is generated by the at least one output transducer at the second electrical port from the received amplified SAW; and wherein the first electrical port is coupled to the second electrical port, where at at least one frequency, a gain of an electrical loop circuit formed by such coupling is greater than unity and a phase of the electrical loop circuit is an integer number of three hundred and sixty degrees.

Example 15 includes the apparatus of any of Examples 10-14, wherein the at least one set of conductive fingers comprises two sets of conductive fingers coupled to the resistive material and formed on the surface of the piezo-electric material in the beam width of the SAW.

Example 16 includes the apparatus of Example 15, further comprising: at least two input transducers formed on the piezoelectric material and each of which is configured to transmit a SAW; and at least two output transducers formed on the piezoelectric material and each of which is configured to receive an amplified SAW.

Example 17 includes the apparatus of Example 16, wherein each input transducer has an input electrical port and each output transducer has an output electrical port; and wherein at least two input electrical ports are electrically coupled; and wherein at least two output electrical ports are electrically coupled.

Example 18 includes an apparatus, comprising: a first set of conductive fingers on piezoelectric material; a second set of conductive fingers on the piezoelectric material and interdigitated with the first set; at least one acousto-electric amplifier between a conductive finger of the first set and a conductive finger of the second set; and wherein the acousto-electric amplifier comprises: resistive material configured to have an electric potential applied across the resistive material; at least one set of amplifier conductive fingers coupled to the resistive material and formed on the surface of the piezo-electric material in the beam width of a surface acoustic wave (SAW) configured to be generated by the first set and the second set; wherein the electric potential is configured to induce majority carrier flow in the resistive material in a same direction as a direction of travel of the SAW, where the majority carriers have a carrier drift velocity greater than a velocity of the SAW in the piezoelectric material; and wherein the resistive material and the at least one set of amplifier conductive fingers are configured to convey energy to the SAW to amplify amplitudes of the electric potentials of the SAW, and thus also amplify an amplitude of a mechanical wave of the SAW.

Example 19 includes the apparatus of Example 18, wherein the interdigitated conductive fingers of the first set and the second set comprise at least one a conductive finger of the first set that is laterally displaced from and is in parallel with one or more conductive fingers of the second set.

Example 20 includes the apparatus of Example 19, where the at least one conductive finger of the first set is between two conductive fingers of the second set.

Example 21 includes the apparatus of any of Examples 18-20, wherein the resistive material is not disposed on the surface of the piezo-electric material within the beam width of the SAW.

Example 22 includes the apparatus of any of Examples 18-21, wherein the resistive material is disposed at a non-orthogonal angle with respect to a width of the at least one set of amplifier conductive fingers.

The terms "about" or "substantially" indicate that the value or parameter specified may be somewhat altered, as long as the alteration does not result in nonconformance of the process or structure to the illustrated embodiment. Finally, "exemplary" indicates the description is used as an example, rather than implying that it is an ideal.

Terms of relative position as used in this application are defined based on a plane parallel to, or in the case of the term coplanar—the same plane as, the conventional plane or working surface of a device, layer, wafer, or substrate, regardless of orientation. The term "horizontal" or "lateral" as used in this application are defined as a plane parallel to the conventional plane or working surface of a device, layer, wafer, or substrate, regardless of orientation. The term "vertical" refers to a direction perpendicular to the horizontal. Terms such as "on," "side" (as in "sidewall"), "higher," "lower," "over," "top," and "under" are defined with respect to the conventional plane or working surface being on the top surface of a device, layer, wafer, or substrate, regardless of orientation. The term "coplanar" as used in this application is defined as a plane in the same plane as the conventional plane or working surface of a device, layer, wafer, or substrate, regardless of orientation.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims. Therefore, it is manifestly intended that this invention be limited only by the claims and the equivalents thereof.

The invention claimed is:

1. A method, comprising:
receiving a surface acoustic wave (SAW) propagating parallel to a surface of a piezoelectric material and in the piezoelectric material;
applying an electric potential across resistive material to induce majority carrier flow in the resistive material in a same direction as a direction of travel of the SAW, where the majority carriers have a carrier drift velocity greater than a velocity of the SAW in the piezoelectric material;
sensing, in a beam width of the SAW, electric potentials of the SAW in the piezoelectric material at different points normal to an axis in which the SAW travels;
coupling the sensed electric potentials to the resistive material;
generating moving potential wells, in the resistive material, which carry charge in a direction of movement of the SAW;
injecting charge from the induced majority carrier flow into the moving potential wells to increase energy stored in the moving potential wells;
conveying the increased energy to the SAW; and
amplifying amplitudes of the electric potentials of the SAW, and thus also amplifying an amplitude of a mechanical wave of the SAW.

2. The method of claim 1, wherein the resistive material is not disposed on the surface of the piezoelectric material within the beam width of the SAW.

3. The method of claim 1, further comprising:
transmitting the SAW from a first transducer comprising a first electrical port; and
receiving the amplified SAW at a second transducer comprising a second electrical port.

4. The method of claim 3, further comprising electrically coupling an electrical signal, generated by the second transducer from the received amplified SAW, to the first transducer, where, at at least one frequency, a gain of an electrical loop circuit formed by such coupling is greater than unity and a phase of the electrical loop circuit is an integer number of three hundred and sixty degrees.

5. An apparatus, comprising:
a resistive material configured to have an electric potential applied across resistive material to induce majority carrier flow in the resistive material in a same direction as a direction of travel of a surface acoustic wave (SAW), where the majority carriers have a carrier drift velocity greater than a velocity of the SAW in a piezoelectric material;
sensors configured to sense, in a beam width of the SAW, electric potentials of the SAW on the piezoelectric material at different points normal to an axis in which the SAW travels;
where the sensors are coupled to the resistive material and are further configured to couple the sensed electric potentials to the resistive material to generate moving potential wells, in the resistive material, which carry charge in a direction of movement of the SAW;

wherein charge from the induced majority carrier flow is injected into the moving potential wells to increase energy in the moving potential wells; and wherein the sensors are further configured to convey the increase energy to the SAW so as to amplify amplifying amplitudes of the electric potentials of the SAW, and thus also amplifying an amplitude of a mechanical wave of the SAW.

6. The apparatus of claim 5, wherein the resistive material is not disposed on a surface of a piezoelectric material within the beam width of the SAW.

7. The apparatus of claim 5, wherein the resistive material is disposed at a non-orthogonal angle with respect to a width of the sensors.

8. The apparatus of claim 5, further comprising:
at least one input transducer formed on the piezoelectric material and each of which is configured to transmit a SAW; and
at least one output transducer formed on the piezoelectric material and each of which is configured to receive a SAW having amplified amplitudes of the electric potentials and the mechanical wave.

9. The apparatus of claim 8, wherein the at least one input transducer has a first electrical port configured to receive an electrical signal;
wherein the at least one output transducer has a second electrical port configured to transmit an electrical signal;
wherein an electrical signal, is generated by the at least one output transducer at the second electrical port from the received amplified SAW; and
wherein the first electrical port is coupled to the second electrical port, where at at least one frequency, a gain of an electrical loop circuit formed by such coupling is greater than unity and a phase of the electrical loop circuit is an integer number of three hundred and sixty degrees.

10. An apparatus, comprising:
resistive material configured to have an electric potential applied across the resistive material;
at least one set of conductive fingers coupled to the resistive material and formed on a surface of a piezoelectric material in a beam width of a surface acoustic wave (SAW);
wherein the electric potential is configured to induce majority carrier flow in the resistive material in a same direction as a direction of travel of the SAW, where the majority carriers have a carrier drift velocity greater than a velocity of the SAW in the piezoelectric material; and
wherein the resistive material and the at least one set of conductive fingers are configured to convey energy to the SAW to amplify amplitudes of electric potentials of the SAW, and thus also amplify an amplitude of a mechanical wave of the SAW.

11. The apparatus of claim 10, wherein the resistive material is not disposed on the surface of the piezoelectric material within the beam width of the SAW.

12. The apparatus of claim 10, wherein the resistive material is disposed at a non-orthogonal angle with respect to a width of the at least one set of conductive fingers.

13. The apparatus of claim 10, further comprising:
at least one input transducer formed on the piezoelectric material and each of which is configured to transmit a SAW; and
at least one output transducer formed on the piezoelectric material and each of which is configured to receive a SAW having amplified amplitudes of the electric potentials and the mechanical wave.

14. The apparatus of claim 13, wherein the at least one input transducer has a first electrical port configured to receive an electrical signal;
wherein the at least one output transducer has a second electrical port configured to transmit an electrical signal;
wherein an electrical signal, is generated by the at least one output transducer at the second electrical port from the received amplified SAW; and
wherein the first electrical port is coupled to the second electrical port, where at at least one frequency, a gain of an electrical loop circuit formed by such coupling is greater than unity and a phase of the electrical loop circuit is an integer number of three hundred and sixty degrees.

15. The apparatus of claim 10, wherein the at least one set of conductive fingers comprises two sets of conductive fingers coupled to the resistive material and formed on the surface of the piezoelectric material in the beam width of the SAW.

16. The apparatus of claim 15, further comprising:
at least two input transducers formed on the piezoelectric material and each of which is configured to transmit a SAW; and
at least two output transducers formed on the piezoelectric material and each of which is configured to receive an amplified SAW.

17. The apparatus of claim 16, wherein each input transducer has an input electrical port and each output transducer has an output electrical port; and
wherein at least two input electrical ports are electrically coupled; and
wherein at least two output electrical ports are electrically coupled.

18. An apparatus, comprising:
a first set of conductive fingers on a piezoelectric material;
a second set of conductive fingers on the piezoelectric material and interdigitated with the first set;
at least one acousto-electric amplifier between a conductive finger of the first set and a conductive finger of the second set; and
wherein each of the at least one acousto-electric amplifier comprises:
resistive material configured to have an electric potential applied across the resistive material;
at least one set of amplifier conductive fingers coupled to the resistive material and formed on a surface of the piezoelectric material in a beam width of a surface acoustic wave (SAW) configured to be generated by the first set and the second set;
wherein the electric potential is configured to induce majority carrier flow in the resistive material in a same direction as a direction of travel of the SAW, where the majority carriers have a carrier drift velocity greater than a velocity of the SAW in the piezoelectric material; and
wherein the resistive material and the at least one set of amplifier conductive fingers are configured to convey energy to the SAW to amplify amplitudes of electric potentials of the SAW, and thus also amplify an amplitude of a mechanical wave of the SAW.

19. The apparatus of claim 18, wherein the interdigitated conductive fingers of the first set and the second set comprise at least one conductive finger of the first set that is laterally displaced from and is in parallel with one or more conductive fingers of the second set.

20. The apparatus of claim 19, where the at least one conductive finger of the first set is between two conductive fingers of the second set.

21. The apparatus of claim 18, wherein the resistive material is not disposed on the surface of the piezoelectric material within the beam width of the SAW.

22. The apparatus of claim 18, wherein the resistive material is disposed at a non-orthogonal angle with respect to a width of the at least one set of amplifier conductive fingers.

* * * * *